United States Patent
Sridharan et al.

(10) Patent No.: US 6,549,078 B1
(45) Date of Patent: Apr. 15, 2003

(54) METHOD AND SYSTEM FOR DIRECTLY MODULATING A VOLTAGE CONTROLLED OSCILLATOR FOR USE IN FREQUENCY/PHASE MODULATED SYSTEMS

(75) Inventors: Guruswami M. Sridharan, Jacksonville, FL (US); Kartik M. Sridharan, Jacksonville, FL (US)

(73) Assignee: Ashvattha Semiconductor Inc., San Diego, CA (US)

( * ) Notice: Subject to any disclaimer, the term of this patent is extended or adjusted under 35 U.S.C. 154(b) by 63 days.

(21) Appl. No.: 09/715,632

(22) Filed: Nov. 18, 2000

(51) Int. Cl.$^7$ ................................................. H03L 7/08
(52) U.S. Cl. .................... 331/17; 331/14; 331/DIG. 2; 327/156; 327/159; 332/127; 332/123; 455/113; 375/376
(58) Field of Search ..................... 331/1 A, 17, DIG. 2, 331/78; 327/156, 159; 332/127, 123; 455/113; 375/376

(56) References Cited

U.S. PATENT DOCUMENTS 4,755,774 A * 7/1988 Heck ........................... 332/123

* cited by examiner

Primary Examiner—Arnold Kinkead
(74) Attorney, Agent, or Firm—Goodwin Procter, LLP

(57) ABSTRACT

A method for generating a plurality of frequencies having predetermined frequency deviations from a phase lock loop device including a VCO having a main voltage input, a modulation voltage input and a frequency output, a first and second feedback loop digital divider, each having an input and an output, a phase frequency detector having a first and second input and an output, a reference frequency generator such as a crystal oscillator having an output, a first and second reference frequency digital divider, each having an input and an output, a loop filter having an input and an output, a switch having an input and a first and a second switched output, a hold circuit having an input and an output, a memory circuit for storing the a lock voltage and the corresponding loop output frequency, the steps including; setting a first initial predetermined value of the first feedback loop digital divider, connecting a switch output to the main input of the VCO, supplying a first predetermined reference frequency to the phase frequency divider, supplying a loop correction voltage Vr, to a main drive input of a VCO, allowing the phase lock loop to lock, switching the switch output to the modulation input of the VCO, changing the initial predetermined value of the first feedback loop digital divider, supplying a second loop correction voltage Vj, allowing the phase lock loop to lock, storing the new lock voltage in a memory circuit.

6 Claims, 3 Drawing Sheets

PLL IN CALIBRATION MODE.

PLL IN NORMAL OPERATIONAL MODE.

PLL IN CALIBRATION MODE.

METHOD AND SYSTEM FOR DIRECTLY MODULATING A VOLTAGE CONTROLLED OSCILLATOR FOR USE IN FREQUENCY/PHASE MODULATED SYSTEMS

BACKGROUND OF THE INVENTION

1. Field of the Invention

The present invention relates generally to a system and method for directly modulating a voltage controlled oscillator for use in a frequency/phase modulated system, more particularly by applying the modulation directly on the voltage controlled oscillator (VCO), calibrating the frequency deviation by changing the reference frequency to precisely the same deviation and noting the delta lock voltage. The modulation is scaled to this calibrated voltage.

2. Prior Art

Communications over RF channels requires a means to get the transmission data to RF and back. This process of imposing the transmission data onto a suitable waveform is accomplished by modulation, wherein some characteristic of a carrier wave is varied in accordance with an information signal, or modulating wave. The modulated signal can then be transmitted over a channel, and the original information-bearing signal is recovered through a process of demodulation upon reception.

One of the most effective carrier frequency generation circuits is the phase locked loop (PLL). FIG. 1 depicts a basic form of the prior art phase locked loop (PLL), consisting of, a phase frequency detector (PFD) 101, a loop filter 102, a VCO 103, and a digital divider (N) 104. A reference frequency is input to the PFD. When the loop is in lock, the output frequency (of) is equal to N*fref. The value of the digital divider can be changed to alter the output frequency. If for instance $f_{ref}$=1 Mhz and N=2400, then $f_o$=2400 Mhz. Thus if N is changed to 2401, then $f_o$=2401 Mhz. It is in this way that a PLL can be used to synthesize precise frequencies which are multiples of the reference frequency (fref). When the value of N is changed the output frequency will change until the loop reaches a steady state, at which time it will lock. The time the loop takes to lock to the new output frequency is determined by the loop filter 102.

One of the uses of a PLL is for a precise frequency reference. Another frequently used application for a PLL is in angular (FM, PM) modulation. A PLL can be angle modulated in several different ways:

1. Changing N 104 periodically to achieve output frequency/phase shifts.
2. Modulating the reference frequency.
3. Injecting the modulation at the PFD 101.
4. Injecting the modulation at the VCO input, The first three modulation methods are used to achieve low frequency modulation, ie., within the loop bandwidth. This is due to the loop filter rejecting any high frequency content. For instance, if we change N 104 at a very fast rate compared to the loop bandwidth, the loop will not react at all since the filter 102 will not allow any high frequency signal to pass through and reach the VCO 103. Of the first three methods, the first is the most accurate since the number N is digital. A common prior art method is to use delta sigma modulation for changing N as described in "*A Multiple Modulator Fractional Divider*" 1990 by Miller and Conley, 44th Annual Symposium on Frequency Control. It is also possible to introduce controlled phase shifts in the divider loop so as to cause phase modulation.

The last method (four) is used for high frequency modulation. The exact opposite effect mentioned in the previous paragraph happens here. Any low frequency content in the modulation waveform will be corrected by the loop and the output frequency will not change. However, high frequency content will not be affected by the loop filter 102. This method of high frequency modulation is known to be very inaccurate since the VCO control voltage's sensitivity changes with VCO center frequency, process variations and temperature variations. Another complication exists in injecting signals into the VCO. In a typical communication system, the frequency deviation required for modulation is a very small percentage of its center frequency. For instance, if a VCO can tune between 2400 Mhz and 2500 Mhz for a tune voltage of 0.5V to 2.5V, then the sensitivity is (2500−2400)/(2.5−0.5)=50 Mhz/V. A typical deviation required is on the order of 150 kHz. Therefore, a very small and precise voltage is needed to achieve this modulation deviation (150 kHz/50 Mhz in this case is approximately 3 mV).

The prior art way to overcome this problem is to use two different input ports for the VCO (FIG. 2). One of them is the main port 201, which is connected to the loop, and therefore has a large sensitivity. The other is a modulation port 202 with small (on the order of frequency deviation) sensitivity.

To achieve a wide band modulation, it is required to modulate low frequencies as well as high frequencies. From the above mentioned methods, modulation can be applied at two places to achieve wide band modulation. For instance, low-frequency modulation can be used to vary the divider N 104, and high frequency modulation can be injected into the VCO 103. This known in the industry as two-point modulation as set forth in "*FM Modulation of Frequency Synthesizers*", by Scott, R. I. H. and Underhill, M. J., IERE Conference on Land Mobile Radio Lancaster (UK) September 1979. The difficulty in this method is in matching the low frequency and the high frequency response characteristics.

A digital modulation method for which the above may be useful is FSK (frequency shift keying). In this method, two discrete frequencies are transmitted to represent logic "1" and logic "0". For example, an FSK signal could have a center frequency of 2400 Mhz and represent a 1 as 2400.150 Mhz and represent a 0 as 2399.850 Mhz. In order to change the transmitted data value from a 1 to 0 the frequency must shift from 2400.150 Mhz to 2399.850 Mhz. The transmitted spectrum occupies a wider bandwidth because of the abrupt changes in data. This problem can be overcome by utilizing Gaussauian frequency shift keying (GFSK), in which the abrupt change from one carrier frequency, to another is made more gradual by introducing a filter into the system. This filter causes the frequency shifts to become more gradual thereby lessening the effect of widening the spectrum. Even with GFSK, the bandwidth for high data rate systems contains both low as well as high frequencies.

Bluetooth is a communication standard that uses the GFSK technique. Bluetooth is a relatively new communication standard for short range communications devices that will be used to link devices such as personnel computers, PDA's, wireless phones and GPS receivers. The Bluetooth standard specifies an operating frequency of 2400 to 2480 Mhz in steps of 1 Mhz with modulation deviations of 140 to 175 kHz. Because a Bluetooth device is meant to be used at relatively short ranges, up to ten meters, it is designed so that it will not interfere with other Bluetooth devices that are within its operating range. In order to minimize the likelihood that any two Bluetooth devices in the same area will be on the same frequency at the same time, the Bluetooth standard incorporates the use of a technique called spread-spectrum frequency hopping. In this technique, a device will use 79 individual randomly chosen frequencies within a designated range, changing from one to another on a regular basis. In the case of Bluetooth, the transmitters change frequencies 1,600 times every second between the 79 RF channels. Each channel is divided into time slots 625 microseconds long.

Since every Bluetooth transmitter uses spread-spectrum transmitting automatically, it's unlikely that two transmitters will be on the same frequency at the same time. This same technique minimizes the risk that portable phones or baby monitors will disrupt Bluetooth devices since any interference on a particular frequency will last only a tiny fraction of a second. While the Bluetooth standard provides for a very loose range of deviations for frequency shifts, the hops must be precisely controlled.

The Bluetooth standard for data transmission specifies a data rate of one mega bit per second (Mbs). Data, (a one or a zero) is transmitted using the FSK technique, this means that a logical one is represented by a frequency and a logical zero is represented by a different frequency. For example, if the center frequency is 2400, and a logical one is represented as 2400 Mhz+150 kHz or 2400.150 Mhz then a logical zero would be represented as 2399.850 Mhz. When the data changes from one logical value to the other the frequency must shift from one value to the other. The Bluetooth standard specifies a data rate of one data bit per micro second, therefore if the data changes each bit, as in the case of a succession of alternate ones and zeros, then the data rate frequency is at a maximum. If conversely, the data is stable, either a one or a zero, then the data rate frequency is at a.minimum. The maximum data rate frequency being 500,000 shifts per second or 500 kHz, and the minimum data rate frequency being 0, or no frequency shifts.

Thus, the modulation data consists of a wide band of frequencies, covering 0 to 500 kHz. To achieve this modulation, a two-point modulation scheme is ideal. As previously mentioned, low-frequency modulation by varying the divider N 104 is precise. However, high frequency modulation by varying the VCO input voltage is not precise. There exists a need to calibrate the high frequency modulation input so that a precise deviation is realized. The present invention solves this calibration problem.

SUMMARY OF THE INVENTION

Therefore it is an object of the present invention to provide a system and method to control a PLL to precisely modulate the output frequency over a wide range of frequencies such as are used in a Bluetooth by setting the reference frequency to a predetermined frequency deviation, noting the lock voltage applied to change the output frequency and storing in memory the lock voltage for each output frequency. Thus scaling the modulation to the calibrated voltage.

Accordingly, a method for generating a plurality of frequencies having predetermined frequency deviations from a phase lock loop device including a VCO having a main voltage input, a modulation voltage input and a frequency output, a first and second feedback loop digital divider, each having an input and an output, a phase frequency detector having a first and second input and an output, a reference frequency generator such as a crystal oscillator having an output, a first and second reference frequency digital divider, each having an input and an output, a loop filter having an input and an output, a switch having an input and a first and a second switched output, a hold circuit having an input and an output, a memory circuit for storing the a lock voltage and the corresponding loop output frequency, the steps including; setting a first initial predetermined value of the first feedback loop digital divider, connecting a switch output to the main input of the VCO, supplying a first predetermined reference frequency to the phase frequency divider, supplying a loop correction voltage Vr, to a main drive input of a VCO, allowing the phase lock loop to lock, switching the switch output to the modulation input of the VCO, changing the initial predetermined value of the first feedback loop digital divider, supplying a second loop correction voltage Vj, allowing the phase lock loop to lock, storing the new lock voltage in a memory circuit.

BRIEF DESCRIPTION OF THE DRAWINGS

These and other features, aspects, and advantages of the methods of the present invention will become better understood with regard to the following description, appended claims, and accompanying drawings where:

DETAILED DESCRIPTION OF THE PREFERRED EMBODIMENT

Figure 1:
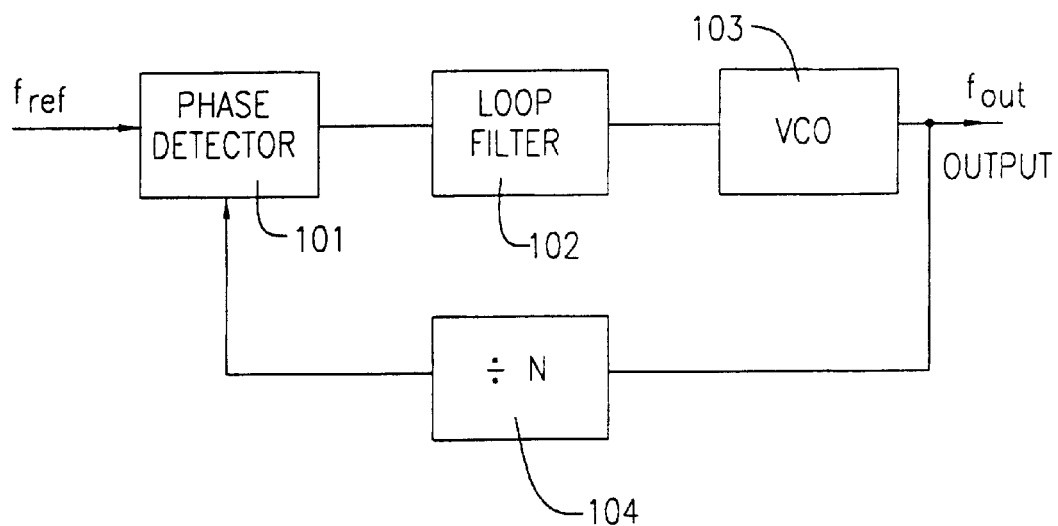
FIG. 1 depicts a basic form of a phase locked loop (PLL).
Figure 2:
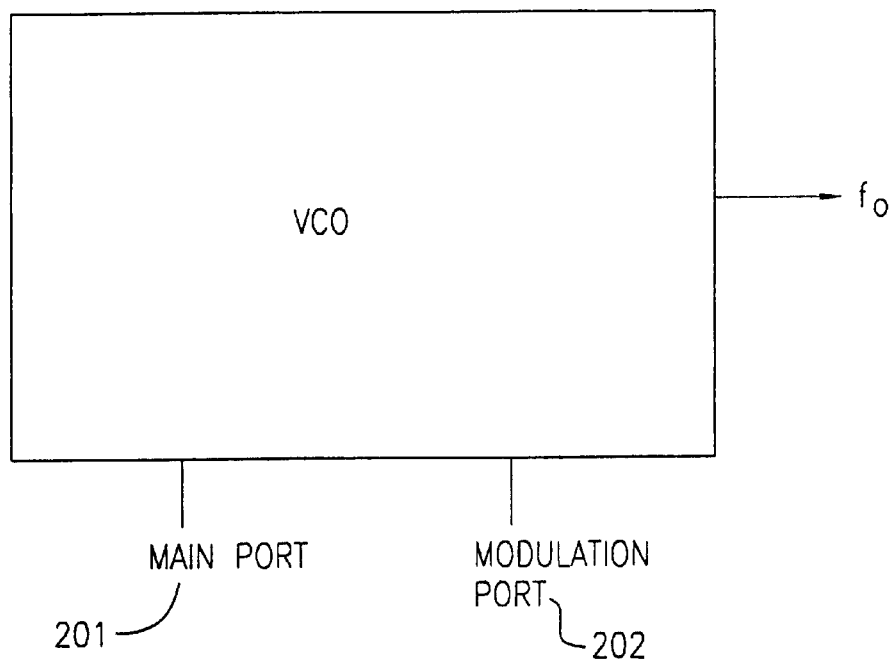
FIG. 2 is a block diagram of a voltage controlled oscillator.

Preferred embodiments of the present invention will be described in detail below while referring to the drawings attached.

Figure 3:
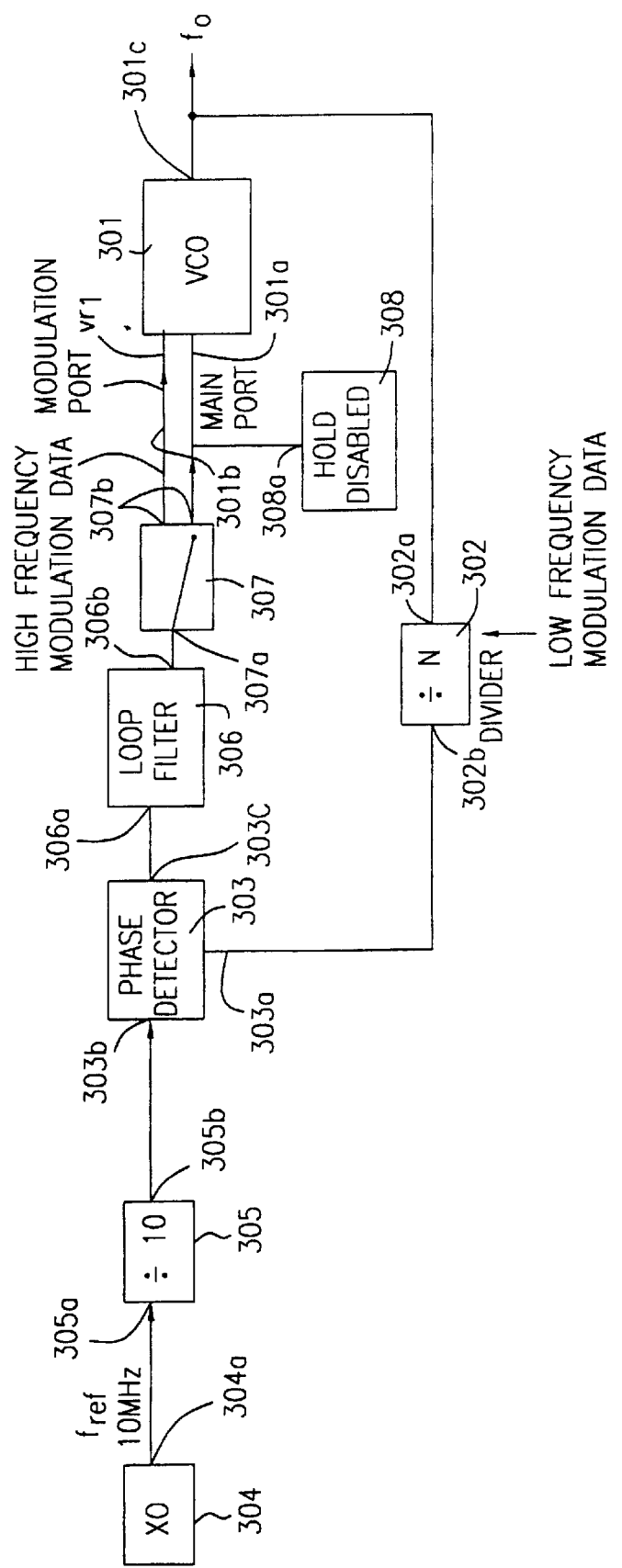
FIG. 3 is a block diagram depicting the PLL circuit of the present invention in normal operation mode.

The phase lock loop of the current invention has a normal operation mode and a calibration mode. FIG. 3 depicts a phase lock loop of the current invention in normal operation mode. The PLL of the current invention includes a VCO 301 having a main voltage input 301a, a modulation voltage input 301b and a frequency output 301c. A feedback loop digital divider 302 having an input 302a and an output 302b, a phase frequency detector 303 having a first input 303a and second input 303b and an output 303c, a reference frequency generator such as a crystal oscillator 304 having an output 304a, a reference frequency digital divider 305 having an input 305a and output 305b, a loop filter 306 having an input 306a and an output 306b, a switch 307 having an input 307a and a switched output 307b and a hold circuit 308 having an input/output 308a where the VCO output 301c is connected to the input of the feedback loop digital divider 302a, the output of the feedback loop digital divider 302b is connected to the first input of the phase frequency detector 303a and the output of the crystal oscillator 304a is connected the input of the reference frequency digital divider 305a whose output 305b is connected to the second input 303b of the phase frequency detector and the output of the phase frequency detector 303c is connected to the loop filter input 306a and the loop filter output 306b is connected to the switch input 307a and one of the switched outputs 307b is connected to the hold circuit input/output 308a which is connected to the VCO main input 301a and where the second switched output is connected to the modulation input 301b of the VCO.

In normal operation mode the switch 307 is connected to the main input of the VCO 301a, the reference frequency is set to 10 Mhz and divided down to 1 MHz, thus 1 Mhz is supplied to the PFD 303, The modulation input to the VCO 301b is connected to a reference voltage Vr. 1 Mhz is a typical example used in Bluetooth, however a fractional synthesizer approach may also be used in which case the reference frequency can be arbitrary. The digital divider 302 value is set to a value, for example 2450 which according to the PLL loop equations produces an output frequency of 2450 Mhz. As previously explained the output frequency can be varied by directly modulating the VCO for high frequency modulation and changing the value of the feedback loop digital divider 302 for low frequency modulation. However the problem with directly modulating the VCO is that the frequency deviation varies when the center frequency changes, and when process, temperature, and supply voltage change. To overcome these difficulties, the PLL of the present invention also includes a calibration mode. This calibration mode will determine what voltage to apply at the modulation port of the VCO to get a specified output frequency deviation.

Figure 4:
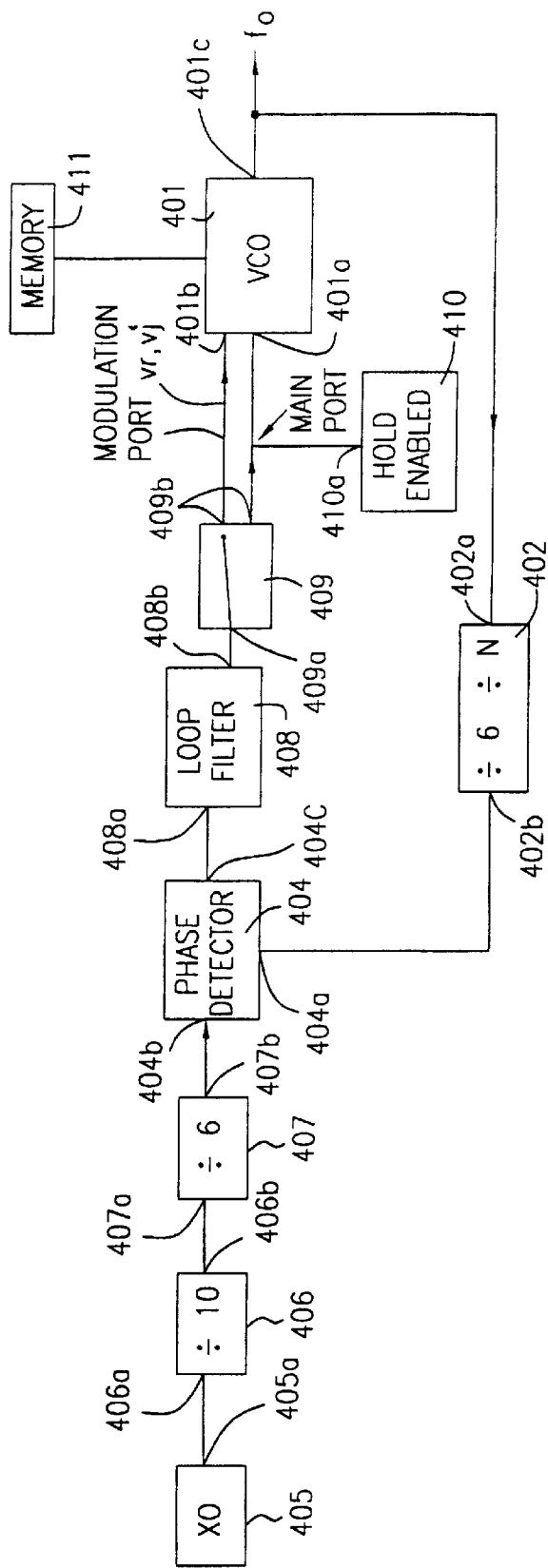
FIG. 4 is a block diagram depicting the PLL circuit of the present invention in calibration mode.

The calibration mode of the phase lock loop of the present invention is depicted in FIG. 4. In calibration mode the device of the present invention includes a VCO 401 having a main voltage input 401a, a modulation voltage input 401b and a frequency output 401c. A feedback loop digital divider 402, having an input 402a, and an output, 402b. A phase frequency detector 404 having a first input 404a, a second input 404b and an output 404c. A reference frequency generator such as a crystal oscillator 405 having an output 405a. A first 406 reference frequency digital divider having an input 406a, and output 406b and a second 407 reference frequency digital divider, having an input and output, and 407a and 407b respectively. A loop filter 408 having an input 408a and an output 408b, a switch 409 having an input 409a and a switched output 409b and a hold circuit 410 having an input/output 410a and a memory circuit 411; where the VCO output 401c is connected to the input 402a of the feedback loop digital divider, the output 402b of the feedback loop digital divider is connected to the first input 404a of the phase frequency detector and the output 405a of the crystal oscillator is connected to the input 406a of the first reference frequency digital divider whose output 406b is connected to the input 407a of the second reference frequency digital divider whose output 407b is connected to the second input 404b of the phase frequency detector and the output 404c of the phase frequency detector is connected to the loop filter input 408a and the loop filter output 408b is connected to the switch input 409a and one of the switched outputs 409b is connected to the hold circuit input/output 410a which is connected to the VCO main input 401a and where the second switched output 409b is connected to the modulation input 401a of the VCO 401 and the memory circuit 411 is connected to the VCO.

The calibration mode is used to determine the lock voltage required to be supplied to the VCO while in normal operation to produce a particular output frequency. deviation. In Bluetooth the frequency deviations for transmitting logical data values must be between 140–175 Khz. It is possible using the method and system of the present invention to calibrate the loop such that the lock voltage to produce a particular frequency deviation is determined and stored in a register while in calibration mode, and then accessed while in normal mode to produce a particular output frequency deviation.

The calibration mode will now be described with reference to particular values for the reference frequency, digital divider and output frequency. However, modifications will be apparent to those skilled in the art. To start the calibration mode the reference frequency is set to 166.666 kHz by interposing an additional ⅙ divider 407 together with the first reference frequency digital divider. In this example the reference frequency is set to be approximately equal to the midpoint of the frequency deviation specified in the Bluetooth standard. In this way, there will be a margin from the calibration value to the limits of the frequency deviation range. Also the feedback loop digital divider's 402 number is multiplied by a factor of 6, thus according to the loop equations, the frequency output will remain unchanged. This is demonstrated as $f_o=N^*f_{ref}=(2450\times6)^*166.666$ kHz, thus= 2450 Mhz.

The switch 409 is connected to the main input 401a of the VCO, and the modulation input 401b is connected to a reference voltage Vr. After the loop locks, the switch is now connected to the modulation input 401b of the VCO and the main input 401a of the VCO is connected to a hold circuit 410 to hold the previously locked voltage. The first feedback loop digital divider number N is now incremented by 1. In our example, the number changes from 2450*6=14700 to 2450*6+1=14701. The PLL new lock voltage is called Vj. The new lock voltage Vj is stored in a memory circuit 411. The number can also be decremented by 1 to get the Vj for the negative frequency deviation if needed.

In actual implementation of this circuit, the hold circuitry may exhibit some glitch, ie., the exact voltage may not be held—it may vary a small amount. In this case, we just let the loop lock with the modulation port and store that voltage. Then, when the divider is incremented by one, we know the new voltage. It is also equivalent to store just the delta between the lock voltages for 2450 Mhz and 2450.1666 Mhz.

If the VCO has linear frequency output response only one calibration step is needed, and the circuit can be switched back to normal operation. However, if the VCO is not linear, the calibration step can be repeated at various points in the frequency range or for greater accuracy at each integer step in the frequency range by incrementing the first feedback loop digital divider, allowing the circuit to settle at the new output frequency, measuring the modulation input voltage and storing the modulation input voltage in a memory circuit with the corresponding output frequency. This is particularly useful in a Bluetooth device where the frequency range is 2400 Mhz to 2480 Mhz in steps of 1 Mhz.

Thus when the loop is in normal operation, to generate a frequency deviation at a particular point in the output frequency range, for example, 2420 Mhz, a control circuit will reference the memory circuit in which the values for input voltages are stored, and retrieve a voltage value corresponding to the point in the frequency range to produce the desired frequency deviation. The low frequency portion of the modulation is low frequency filtered and converted to a number and fed at each reference clock cycle to the digital divider N. The high frequency portion is high frequency filtered and fed into the VCO modulation port and is correctly scaled to the calibration voltage measured in the calibration mode for that particular frequency.

The calibration step can be repeated as often as is needed to account for variations in operating conditions.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method for generating a plurality of frequencies having predetermined frequency deviations from a phase lock loop device including a VCO having a main voltage input, a modulation voltage input and a frequency output, a first and second feedback loop digital divider, each having an input and an output, a phase frequency detector having a first and second input and an output, a reference frequency generator such as a crystal oscillator having an output, a first and second reference frequency digital divider, each having an input and an output, a loop filter having an input and an output, a switch having an input and a first and a second switched output, a hold circuit having an input and an output, a memory circuit for storing the main voltage input and the corresponding loop output frequency, the steps including;

setting a first initial predetermined input of the first feedback loop digital divider, connecting said first switched output to the main voltage input of the VCO, supplying a first predetermined reference frequency to the first feedback loop digital divider, supplying a loop correction voltage Vr, to the main voltage input of the VCO, allowing the phase lock loop device to lock, connecting said second switched output to the modulation voltage input of the VCO, changing the input of the first feedback loop digital divider to a second input, supplying a second loop correction voltage Vj, allowing the phase lock loop device to lock, and storing a new lock voltage in the memory circuit.

2. The method of claim 1, wherein the VCO has a linear characteristic.

3. The method of claim 1, wherein changing the input of the first feedback loop digital divider is incrementing the input.

4. The method of claim 1, wherein changing the input of the first feedback loop digital divider is decrementing the input.

5. The method of claim 1, further including the step of repeating each of the method steps for a plurality of initial predetermined inputs of the first feedback loop digital divider.

6. A frequency generation device for generating a plurality of frequencies having predetermined frequency deviation comprising:

a VCO having a main voltage input, a modulation voltage input and a frequency output, a first and second feedback loop digital divider, each having an input and an output, a phase frequency detector having a first and second input and an output, a reference frequency generator such as a crystal oscillator having an output, a first and second reference frequency digital divider, each having an input and an output, a loop filter having an input and an output, a switch having an input and a first and a second switched output, a hold circuit having an input and an output, a memory circuit for storing the main voltage input and the corresponding frequency output, wherein the frequency output is connected to the input of the first feedback loop digital divider, the output of the first feedback loop digital divider is connected to the input of the second feedback loop digital divider, the output of the second feedback loop digital divider is connected to the first input of the phase frequency detector and the output of the crystal oscillator is connected the input of the first reference frequency digital divider whose output is connected to the input of the second reference frequency digital divider whose output is connected to the second input of the phase frequency detector and the output of the phase frequency detector is connected to the loop filter input and the loop filter output is connected to the switch input and said first switched outputs is connected to the hold circuit input whose output is connected to the VCO main voltage input and the second switched output is connected to the modulation voltage input of the VCO and the memory circuit is connected to the modulation voltage input of the VCO.

* * * * *